United States Patent
Beck

(10) Patent No.: US 11,621,632 B2
(45) Date of Patent: Apr. 4, 2023

(54) COMPONENT

(71) Applicant: TDK Electronics AG, Munich (DE)

(72) Inventor: Fabian Beck, Ruettenen (CH)

(73) Assignee: TDK ELECTRONICS AG, Munich (DE)

( * ) Notice: Subject to any disclaimer, the term of this patent is extended or adjusted under 35 U.S.C. 154(b) by 336 days.

(21) Appl. No.: 16/625,558

(22) PCT Filed: Jun. 7, 2018

(86) PCT No.: PCT/EP2018/065059
§ 371 (c)(1),
(2) Date: Dec. 20, 2019

(87) PCT Pub. No.: WO2018/234057
PCT Pub. Date: Dec. 27, 2018

(65) Prior Publication Data
US 2020/0220453 A1  Jul. 9, 2020

(30) Foreign Application Priority Data
Jun. 20, 2017  (DE) .......................... 102017113556.1

(51) Int. Cl.
*H02M 1/44* (2007.01)
*H01F 27/08* (2006.01)
(Continued)

(52) U.S. Cl.
CPC ............ *H02M 1/44* (2013.01); *H01F 27/085* (2013.01); *H01F 27/24* (2013.01); *H02M 7/003* (2013.01);
(Continued)

(58) Field of Classification Search
CPC ...... H02M 1/44; H02M 7/003; H02M 7/5387; H01F 27/085; H01F 27/24; H03H 7/0115;
(Continued)

(56) References Cited

U.S. PATENT DOCUMENTS

| 7,944,326 B2 | 5/2011 | Tucker |
| 8,816,795 B2 | 8/2014 | Beck |
| 9,019,043 B2 | 4/2015 | Beck et al. |
| 9,331,657 B2 | 5/2016 | Ohashi |

(Continued)

FOREIGN PATENT DOCUMENTS

| CH | 709660 A2 | 11/2015 |
| CN | 101897109 A | 11/2010 |

(Continued)

OTHER PUBLICATIONS

TDK, "EMC filter, 2-line filter for drive inverter, 600 VDC, 350A, 85° C.," Datasheet, Preliminary data, Ordering code: 100316-S002, Nov. 10, 2016, version 51, pp. 1-4.

*Primary Examiner* — Hafizur Rahman
*Assistant Examiner* — Kimberly E Glenn
(74) *Attorney, Agent, or Firm* — Slater Matsil, LLP

(57) ABSTRACT

A component is disclosed. In an embodiment a component includes a first region suitable for a feedthrough of at least one bus bar and a second region in which at least one discrete device is arranged, wherein the first region and the second region are separated from one another by a cooling region thermally decoupling the first region from the second region.

20 Claims, 3 Drawing Sheets

(51) Int. Cl.
*H01F 27/24* (2006.01)
*H02M 7/00* (2006.01)
*H03H 7/01* (2006.01)
*H05K 1/02* (2006.01)
*H05K 1/18* (2006.01)
*H02M 7/5387* (2007.01)
*H02P 27/06* (2006.01)

(52) U.S. Cl.
CPC ......... *H03H 7/0115* (2013.01); *H05K 1/0203* (2013.01); *H05K 1/181* (2013.01); *H02M 7/5387* (2013.01); *H02P 27/06* (2013.01); *H05K 2201/1003* (2013.01); *H05K 2201/1006* (2013.01); *H05K 2201/10015* (2013.01); *H05K 2201/10272* (2013.01); *H05K 2201/10356* (2013.01)

(58) Field of Classification Search
CPC ................. H05K 1/0203; H05K 1/181; H05K 2201/10015; H05K 2201/1003; H05K 2201/1006; H05K 2201/10272; H05K 2201/10356; H02P 27/06
See application file for complete search history.

(56) References Cited

U.S. PATENT DOCUMENTS

| | | |
|---|---|---|
| 2005/0036262 A1 | 2/2005 | Siebenthall et al. |
| 2016/0226334 A1* | 8/2016 | Falguier .................. H02K 11/33 |
| 2018/0049314 A1 | 2/2018 | Amaducci et al. |
| 2018/0323764 A1* | 11/2018 | Werker .................. H05K 1/181 |

FOREIGN PATENT DOCUMENTS

| | | |
|---|---|---|
| CN | 202076118 U | 12/2011 |
| CN | 103178320 A | 6/2013 |
| CN | 103270696 A | 8/2013 |
| CN | 203386657 U | 1/2014 |
| DE | 102005013509 A1 | 10/2005 |
| DE | 102013101323 A1 | 8/2014 |
| DE | 202016102587 U1 | 6/2016 |
| DE | 202016104468 U1 | 8/2016 |
| DE | 102016110742 A1 | 12/2017 |
| GB | 2023931 A | 1/1980 |
| JP | H06038224 U | 5/1994 |
| JP | 2006173414 A | 6/2006 |
| JP | 2014082738 A | 5/2014 |
| WO | 2012059132 A1 | 5/2012 |
| WO | 2016074955 A1 | 5/2016 |

* cited by examiner

COMPONENT

COMPONENT

This patent application is a national phase filing under section 371 of PCT/EP2018/065059, filed Jun. 7, 2018, which claims the priority of German patent application 102017113556.1, filed Jun. 20, 2017, each of which is incorporated herein by reference in its entirety.

TECHNICAL FIELD

The present invention relates to a component. The component may for example be used in automotive applications as an EMC filter (EMC=electromagnetic compatibility).

BACKGROUND

Various requirements are made of such a component in the automotive sector. The component needs to be as light as possible, to enable weight optimization and miniaturization. In addition, the component is often connected with terminals or bus bars, which may be exposed to high temperatures and/or vibrations. The component therefore has to be as insensitive as possible to high temperatures or mechanical disturbances.

SUMMARY OF THE INVENTION

Embodiments provide an improved component. The component should, for example, be suitable for connection with terminals or bus bars which have a high temperature.

A component is proposed which comprises a first region, which is suitable for feedthrough of at least one bus bar, and a second region, in which at least one discrete device is arranged, wherein the first region and the second region are separated from one another by a cooling region, which thermally decouples the first region from the second region.

The component may in particular be a filter component. In the automotive sector a filter component may be connected with terminals or bus bars which may be exposed to high temperatures and/or vibrations. The proposed filter component is insensitive to high temperatures, since the first region and the second region are separated from one another by the cooling region, wherein the cooling region thermally decouples the first region from the second region. This configuration may also protect the second region of the filter component from vibrations of the bus bar.

The filter component may be configured to modify an electrical signal in terms of amplitude and phase angle as a function of frequency. In this way, undesired signal components may be attenuated or suppressed.

Through the thermal decoupling of the first region from the second region, it is possible to ensure that the at least one discrete device is not exposed to excessive temperatures, even if the bus bar is very hot. The at least one discrete device may thus be protected by the cooling region from an excessive bus bar temperature. Thus, the component does not require any design-dependent upper limit to be set for the temperature of the bus bar in order to protect the at least one discrete device. Rather, the component may also be used in combination with a bus bar which is very hot.

The first region and the second region may be separated spatially from one another by the cooling region. In this respect, the first region may adjoin the cooling region on one side and the second region may adjoin the cooling region on a second side. The component may comprise a housing, wherein both the first region and the second region and also the cooling region are arranged within the housing.

The bus bar does not have to be a constituent part of the component. Rather, the component may be produced and sold without the bus bar. The bus bar may be a constituent part of an application, for example of a further unit, which is interconnected with the component.

The first region may comprise a tube through which the at least one bus bar may be fed. The first region may also be suitable for feedthrough of multiple, for example two, bus bars. The first region may comprise a separate tube for each of the bus bars.

If the at least one bus bar is fed through the first region, the at least one bus bar extends from a first end of the first region to a second end of the first region. In this case, the at least one bus bar may extend within the housing of the component.

The second region may comprise a printed circuit board (PCB). The at least one discrete device may be arranged on the printed circuit board.

The second region may comprise multiple discrete devices. The discrete devices may for example be capacitors or other devices, for example resistors. The discrete devices may be constituent parts of a filter circuit. The further discrete devices may also be arranged on the printed circuit board.

The first region and the second region may be considered to be thermally decoupled from one another if the cooling region ensures that in the second region the temperature is lower than in the first region. Thermal decoupling of the two regions may take place when the first region is heated by the bus bar. If, for example, a current flows through the bus bar, temperatures of markedly over 100° C. may be reached in the first region. The second region may be considered to be thermally decoupled from the first region if the temperature in the second region is at least 10° C. lower than the temperature in the first region. Preferably, the temperature in the second region is at least 25° C. lower than in the first region. Alternatively, the second region may be considered to be thermally decoupled from the first region if the temperature in the second region is at least 40° C. lower than a temperature in the first region.

The cooling region may be configured to absorb and dissipate heat emitted by the first region. In this way, the cooling region may ensure that the first region heats the second region only to a slight degree. The cooling region may to this end be filled with a material which acts as a thermal insulator. For example, the cooling region may be filled with air. As an alternative or in addition to the air filling, the cooling region may comprise a layer of a plastics material. Both air and the plastics layer act as thermal insulators, which do not feed the heat emitted by the first region in its entirety to the second region.

In this way, it can be ensured that the at least one discrete device, which is arranged in the second region, is not damaged by heat emitted by the bus bar. Accordingly, the cooling region may enable the component also to be used for applications in which the bus bar is heated to a very high level. This is often the case, for example, in the automotive sector. The bus bar may there have a current density of 3 A/mm2 or more. Such a current density is associated with considerable heating of the bus bar.

The at least one discrete device may be a capacitor. The second region may comprise multiple discrete devices, wherein these may be multiple capacitors. Other discrete devices, for example resistors, may also be arranged in the second region.

In the first region at least one inductor may be arranged, which encloses the bus bar if the bus bar is fed through the first region. The inductor may be a magnetic core. The inductor may in particular be a ferrite core or a nanocrystalline core. The inductor may enclose a tube through which the at least one bus bar may be fed. If the first region comprises multiple tubes through each of which a bus bar may be fed, the inductor may enclose all the tubes of the first region.

The first region may comprise multiple inductors which are interconnected with the at least one discrete device and optionally with further discrete devices. The inductor and the at least one discrete device may be interconnected to form an LC filter circuit.

The first region may comprise a tube which extends through the first region and is suitable for accommodating the bus bar. The first region may comprise multiple tubes, wherein each of the tubes is suitable for accommodating a bus bar. The tubes may guide the bus bars and be configured in such a way as to allow electrical contacting of the bus bar with the component.

The tube may be dimensioned such that an internal wall of the tube and the bus bar are separated from one another by an air layer. The air layer between the internal wall of the tube and the bus bar may contribute to thermal insulation of the bus bar, in addition to the cooling region. The air layer may ensure that heat emitted by the bus bar is transmitted only to a damped extent to the internal wall of the tube.

The at least one discrete device may be electrically connected to the tube via a cable or a printed circuit board (PCB). Connection of the at least one device via a cable may be configured in such a way that vibrations of the bus bar are not transmitted in their entirety to the discrete device. Rather, by way of the cable, the connection of the tube with the discrete devices may ensure mechanical decoupling between the bus bar and the devices. The cable may have sufficient play for this purpose. If, instead of the cable, a PCB is used to connect the at least one discrete device with the tube, the PCB may also ensure that vibrations of the bus bar are not transmitted in their entirety to the discrete device. A PCB is typically flexible and may accordingly absorb and damp the vibrations.

In particular in the case of application in the automotive sector, the bus bar may be exposed to mechanical disturbances, for example vibrations, or considerable mechanical forces. By configuring the component so that the tube and the discrete devices are connected together by cable, it is possible to ensure that the discrete devices are protected from these mechanical disturbances and mechanical forces.

The cable may extend through the cooling region. If the cable is heated significantly at its connection point by the bus bar, it can be cooled down within the cooling region such that the cable does not pass the heat emitted by the bus bar on in its entirety to the discrete devices. Accordingly, the cooling region may ensure that there is an electrical connection between the discrete devices and the bus bar without resulting in overheating of the devices. Since the volume of the component is not increased significantly by the cooling region, the cooling region may enable further miniaturization of the component.

The tube may comprise an insulating material and electrically conductive contacts for connection with the cable. The tube may accordingly make it possible to insulate the bus bars relative to the further constituent parts of the component.

The cable may be connected with the tube in such a way that the first region and the second region are mechanically decoupled. Accordingly, vibrations of the bus bars and forces which act on the bus bars are not transmitted to the at least one discrete device. In this way, mechanical damage can be prevented and service life increased.

The cable may be connected to the tube by way of a spring-loaded connection. The spring-loaded connection may for example comprise screws with a spring mechanism.

The component may comprise at least one bus bar, which is arranged in the first region. According to this embodiment, the bus bar is a constituent part of the component. In alternative embodiments, the bus bar is not a constituent part of the component. In this case, the bus bar is instead a constituent part of a further unit, which is interconnected with the component.

The bus bar may consist of copper or aluminum. The component may comprise multiple, for example two, bus bars.

The component may be a filter component, for example an EMC filter.

BRIEF DESCRIPTION OF THE DRAWINGS

The present invention is explained in greater detail below on the basis of the appended figures.

DETAILED DESCRIPTION OF ILLUSTRATIVE EMBODIMENTS

Figure 1:
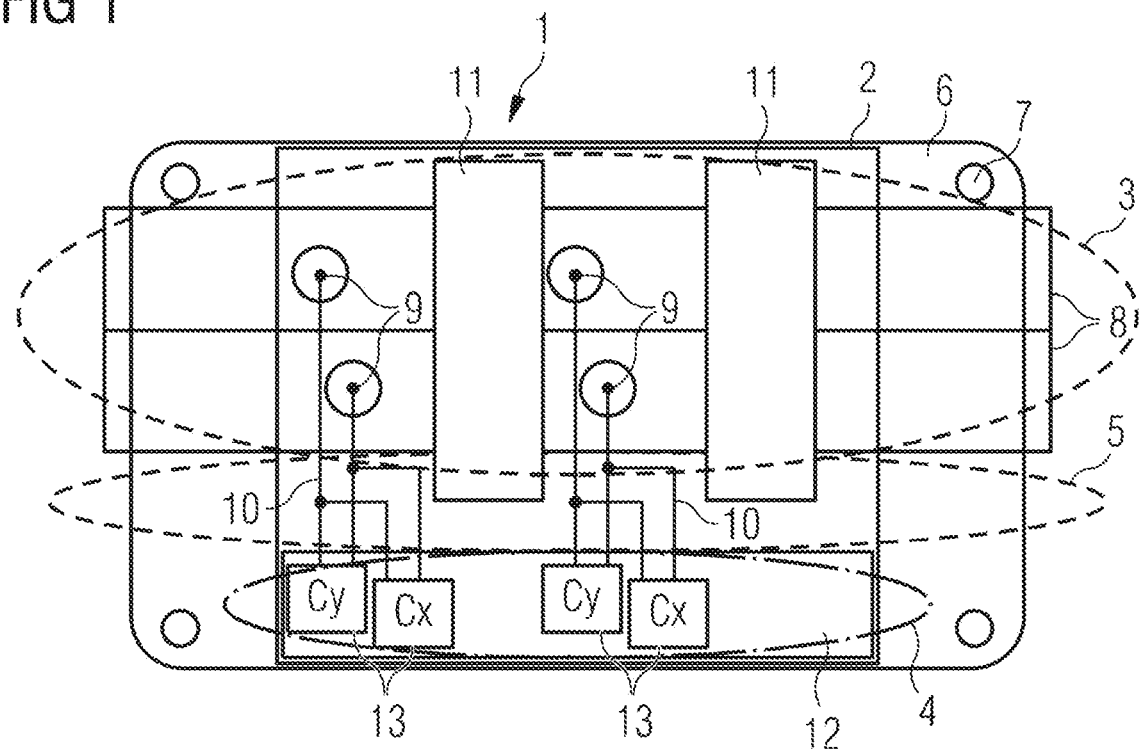
FIG. 1 is a schematic view of a component according to a first exemplary embodiment.

FIG. 1 shows a component 1. The component 1 is a filter component. The component 1 comprises a housing 2. An interior of the housing 2 is subdivided into a first region 3, a second region 4 and a cooling region 5. The cooling region 5 is arranged between the first region 3 and the second region 4. The component 1 additionally comprises a cooling plate 6, to which the housing 2 is fastened. The cooling plate 6 may convey heat away from the housing 2. In addition, the cooling plate 6 comprises orifices 7, which allow mechanical fastening of the component 1.

The first region 3 is configured such that two bus bars are fed through the first region 3. The bus bars are not in this case constituent parts of the component 1, but rather belong to an external unit which may be interconnected with the component 1. The first region 3 comprises two tubes 8, wherein one bus bar may be fed respectively through each of the tubes 8.

The tubes 8 comprise an insulating material and conductive contacts 9, to each of which a cable 10 is connected. Bus bars arranged in the tubes 8 may be electrically contacted via the contacts 9 and the cables 10. As an alternative to the cables 10, printed circuit boards (PCB) could be used to contact the contacts 9 of the tube 8.

In the exemplary embodiment shown in FIG. 1, each tube 8 comprises two conductive contacts 9. In alternative exemplary embodiments, each tube 8 may comprise just one contact 9 or more than two contacts 9.

The tubes 8 have a rectangular cross-section. In this case, the tubes 8 comprise four side walls, wherein mutually adjacent side walls are each placed perpendicular to one another. The side walls consist of the insulating material, wherein the conductive contacts 9 are arranged on one of the side walls.

The first region 3 additionally comprises two inductors 11. The inductors 11 comprise annular magnetic cores, which consist of a ferrite. Alternatively, the inductors 11 may be nanocrystalline cores. Each of the inductors 11 encloses the two tubes 8. Accordingly, the inductors 11 interact via an inductive coupling with bus bars which are arranged inside the tubes 8 if current is flowing through the bus bars.

The second region 4 comprises a printed circuit board 12. Multiple discrete devices 13 are arranged on the printed circuit board 12. The discrete devices 13 are capacitors.

The printed circuit board 12 is electrically connected with the cables 10, which are connected to the contacts 9 of the tubes 8. Accordingly, the discrete devices 13 are also interconnected with the bus bar.

The discrete devices 13 and the inductors 11 form a filter circuit. In alternative exemplary embodiments, the number of discrete devices 13 and inductors 11 may be varied. The component 1 comprises at least one inductor 11 or at least one capacitor. The component 1 may also comprise multiple inductors 11 and/or multiple discrete devices 13, for example multiple capacitors.

The cables 10, which connect together the tubes 8 and the printed circuit board 12, have a degree of play and are not under tension. Accordingly, vibrations or forces which act on the tubes 8 are not transmitted or are transmitted only to a very slight degree via the cables 10 to the printed circuit board 12 and the discrete devices 13. Accordingly, the discrete devices 13 may be protected by the cables 10 not under mechanical tension from damage due to forces which act on the tubes 8 or on bus bars arranged in the tubes 8.

Furthermore, the component 1 comprises the above-stated cooling region 5. In the exemplary embodiment shown in FIG. 1, the cooling region 5 is filled with air. Alternatively or in addition, a layer of a material which acts as a thermal insulator may be arranged in the cooling region 5. The cooling region 5 ensures thermal decoupling of the second region 4 from the first region 3. High temperatures may arise in the first region 3, because the bus bars may become very hot. In automotive sector applications, for example, current densities of greater than 3 A/mm2 are usual. The cooling region 5 ensures that these temperatures reach the second region 4 only in moderated form, such that on heating of the first region 3 a temperature of the second region 4 is at least 10° C., preferably at least 25° C., lower than the temperature of the first region 3.

Figure 2:
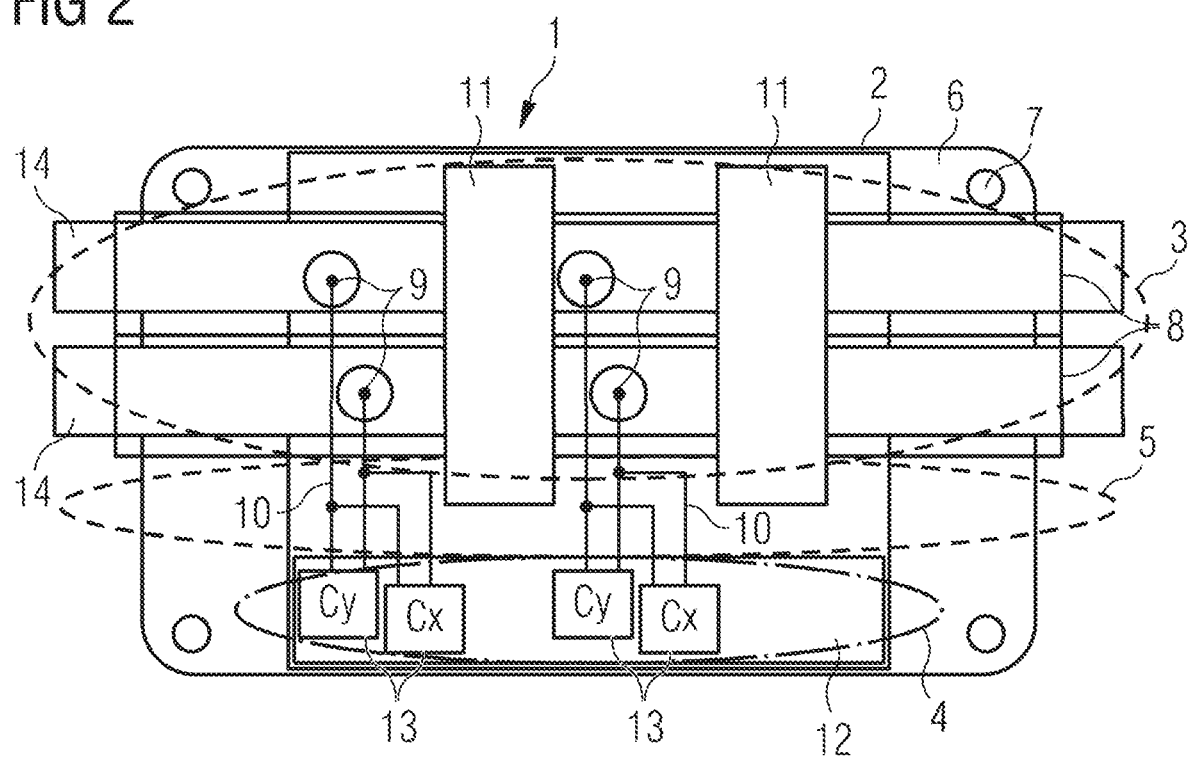
FIG. 2 is a schematic view of a component according to a second exemplary embodiment.

FIG. 2 is a schematic view of a component 1 according to a second exemplary embodiment. The component 1 according to the second exemplary embodiment differs from the exemplary embodiment shown in FIG. 1 in that it comprises two bus bars 14 which are constituent parts of the component 1. The bus bars 14 may be connected with further units via corresponding terminals. The bus bars 14 extend parallel to one another, wherein each of the bus bars 14 is arranged in precisely one tube 8. Each of the bus bars 14 is connected with two conductive contacts 9, which are each contacted with the second region 4 via a cable 10. The bus bars 14 may consist of copper or aluminum.

Figure 3:
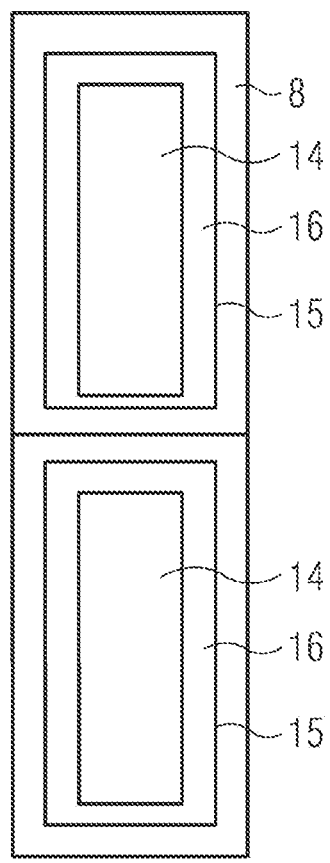
FIG. 3 shows a cross-section through a part of the component according to the second exemplary embodiment.

FIG. 3 shows a cross-section through the two tubes 8 of the component 1 according to the second exemplary embodiment. The tubes 8 are dimensioned so as in each case to leave an air layer 16 between the bus bar 14 arranged in the tube 8 and an internal wall 15 of the tube 8. This air layer 16 acts as a thermal insulator and ensures that the internal wall 15 of the tubes 8 is heated to a lesser degree than would be the case if the bus bars 14 were to rest directly against the internal wall 15.

Figure 4:
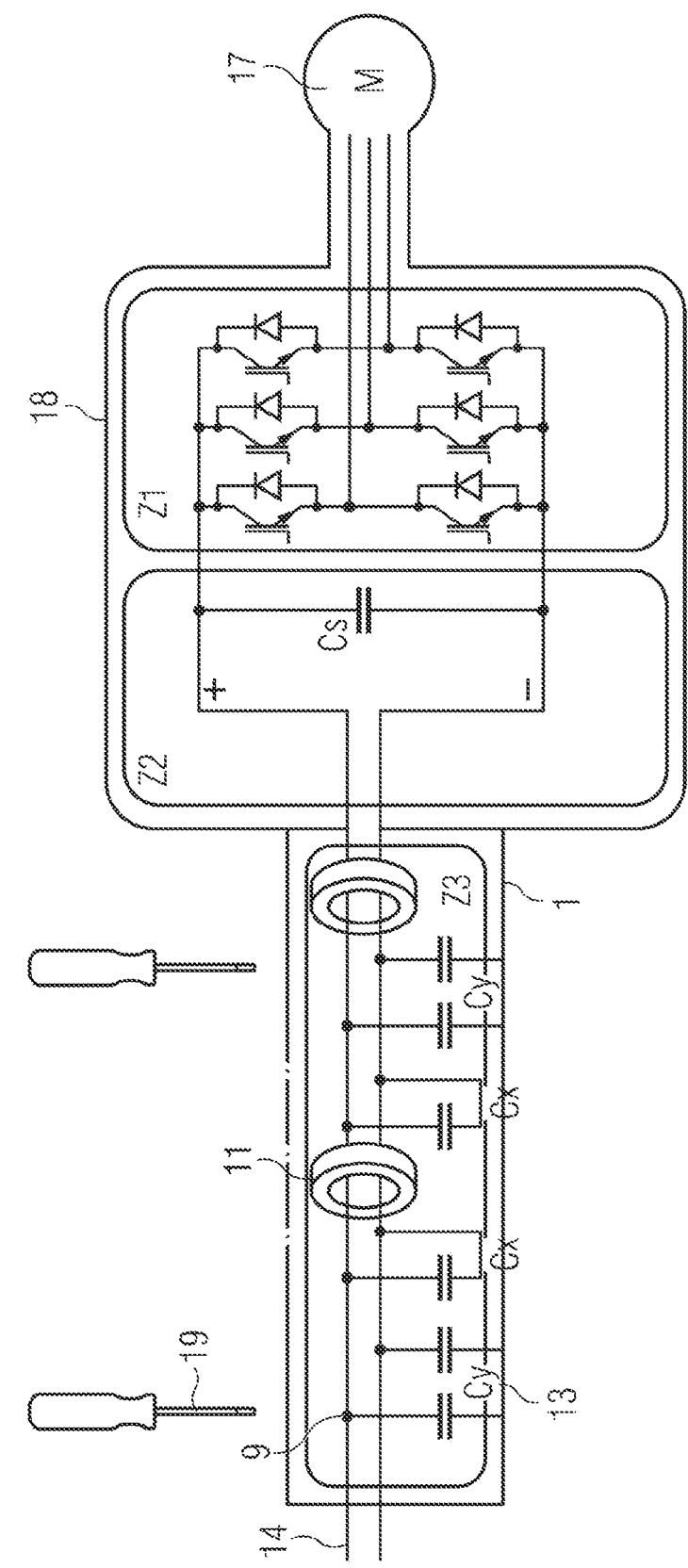
FIG. 4 shows an interconnection of the component with a motor and a further unit.

FIG. 4 shows interconnection of the component 1 according to the first exemplary embodiment with a motor 17 and a further unit 18. The further unit 18 here comprises an inverter.

The further unit 18 comprises two bus bars 14 which are fed through the component 1. In the exemplary embodiment shown here, each of the bus bars 14 is electrically connected to the second region 4 by four contacts 9.

FIG. 4 further indicates that the contacts may be closed via a spring-loaded connection 19, in particular a spring-loaded screw fastening. The spring-loaded connection 19 may cushion forces acting on the bus bars 14 and ensure that the forces are not transmitted to the printed circuit board 12. In addition, the spring-loaded connection 19 may cushion the weight of the bus bars 14 and so mechanically relieve the load on the second region 4 and the terminals of the further unit 18.

The invention claimed is:

1. A component comprising:
a first region suitable for a feedthrough of at least one bus bar; and
a second region in which at least one discrete device is arranged,
wherein the first region and the second region are separated from one another by a cooling region thermally decoupling the first region from the second region,
wherein the cooling region is filled with air, and
wherein the component is an EMC filter.

2. The component according to claim 1, wherein the cooling region comprises a layer of a plastics material.

3. The component according to claim 1, wherein the at least one discrete device is a capacitor.

4. The component according to claim 1, wherein, in the first region, at least one inductor is arranged which encloses the at least one bus bar when the at least one bus bar is fed through the first region.

5. The component according to claim 1, wherein the first region comprises a tube extending through the first region and being suitable for accommodating the at least one bus bar.

6. The component according to claim 5, wherein the tube is dimensioned such that an internal wall of the tube and the at least one bus bar are separated from one another by an air layer.

7. The component according to claim 5, wherein the at least one discrete device is electrically connected to the tube via a cable or a printed circuit board.

8. The component according to claim 7, wherein the cable extends through the cooling region.

9. The component according to claim 7, wherein the tube comprises an insulating material and electrically conductive contacts for connection with the cable.

10. The component according to claim 7, wherein the cable is connected with the tube such that the first region and the second region are mechanically decoupled.

11. The component according to claim 7, wherein the cable is connected to the tube via a spring-loaded connection.

12. The component according to claim 1, wherein the component comprises the at least one bus bar arranged in the first region.

13. The component according to claim 1, wherein the component is a filter component.

14. A component comprising:
a first region suitable for a feedthrough of at least one bus bar; and
a second region in which at least one discrete device is arranged,
wherein the first region and the second region are separated from one another by a cooling region thermally decoupling the first region from the second region, and
wherein, in the first region, at least one inductor is arranged which encloses the at least one bus bar when the at least one bus bar is fed through the first region.

15. A component comprising:
a first region suitable for a feedthrough of at least one bus bar; and
a second region in which at least one discrete device is arranged,
wherein the first region and the second region are separated from one another by a cooling region thermally decoupling the first region from the second region,
wherein the first region comprises a tube extending through the first region and being suitable for accommodating the at least one bus bar, and
wherein the tube is dimensioned such that an internal wall of the tube and the at least one bus bar are separated from one another by an air layer.

16. A component comprising:
a first region suitable for a feedthrough of at least one bus bar; and
a second region in which at least one discrete device is arranged,
wherein the first region and the second region are separated from one another by a cooling region thermally decoupling the first region from the second region,
wherein the first region comprises a tube extending through the first region and being suitable for accommodating the at least one bus bar, and
wherein the at least one discrete device is electrically connected to the tube via a cable or a printed circuit board.

17. A component comprising:
a first region suitable for a feedthrough of at least one bus bar; and
a second region in which at least one discrete device is arranged,
wherein the first region and the second region are separated from one another by a cooling region thermally decoupling the first region from the second region,
wherein the cooling region is filled with air, and
wherein the first region comprises a tube extending through the first region and being suitable for accommodating the at least one bus bar.

18. The component according to claim 17, wherein the tube is dimensioned such that an internal wall of the tube and the at least one bus bar are separated from one another by an air layer.

19. The component according to claim 17, wherein the at least one discrete device is electrically connected to the tube via a cable or a printed circuit board.

20. The component according to claim 19, wherein the cable extends through the cooling region.

\* \* \* \* \*